United States Patent
Dhong et al.

(10) Patent No.: US 7,724,567 B2
(45) Date of Patent: May 25, 2010

(54) MEMORY DEVICE AND METHOD OF REFRESHING

(75) Inventors: Sang Dhong, San Jose, CA (US); Jin Cho, Palo Alto, CA (US); John Wuu, Fort Collins, CO (US); Gurupada Mandal, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 81 days.

(21) Appl. No.: 12/167,821

(22) Filed: Jul. 3, 2008

(65) Prior Publication Data
US 2010/0002502 A1   Jan. 7, 2010

(51) Int. Cl.
  G11C 11/36    (2006.01)
(52) U.S. Cl. ............... 365/175; 365/49.17; 365/174; 365/179
(58) Field of Classification Search ........... 365/49.1, 365/49.17, 174, 175, 179
See application file for complete search history.

(56) References Cited

U.S. PATENT DOCUMENTS

| | | | |
|---|---|---|---|
| 6,778,435 B1 * | 8/2004 | Han et al. ............... 365/174 |
| 7,019,999 B1 * | 3/2006 | Srinivasan et al. ......... 365/49.1 |
| 7,120,040 B2 | 10/2006 | Perry et al. | |
| 7,183,590 B2 | 2/2007 | Zheng et al. | |
| 7,268,373 B1 * | 9/2007 | Gupta et al. ............... 257/162 |
| 7,298,637 B2 | 11/2007 | Ma et al. | |
| 7,466,586 B2 * | 12/2008 | Kim ........................ 365/175 |
| 2008/0239803 A1 * | 10/2008 | Cho ........................ 365/180 |

OTHER PUBLICATIONS

Cho et al., "A novel capacitor-less DRAM cell using Thin Capacitively-Coupled Thyristor (TCCT)," Electron Devices Meeting, 2005, IEDM Technical Digest, IEEE International, published Dec. 5-7, 2005, pp. 311-314.

* cited by examiner

*Primary Examiner*—Richard Elms
*Assistant Examiner*—Hien N Nguyen

(57) ABSTRACT

A content addressable memory includes a first plurality of search lines, a second plurality of search lines, a first match line, and a storage location. Each search line of the first plurality of search lines receives a corresponding high voltage level or low voltage level during a match detect operation, and each search line of the second plurality of search lines to receive a corresponding high voltage level or low voltage level during the match detect operation. The storage location of the content addressable memory includes a plurality of CAM cells, each CAM cell a first thyristor and second thyristor.

18 Claims, 10 Drawing Sheets

| CAM BIT | T1 | T2 |
|---|---|---|
| L | C | NC |
| H | NC | C |
| X | NC | NC |
| $\overline{X}$ | C | C |

CAM CELL STATE TABLE

| CAM BIT | SL | nSL |
|---|---|---|
| L | 1 | 0 |
| H | 0 | 1 |
| X | 0 | 0 |
| $\overline{X}$ | 1 | 1 |

SEARCH LINE STATE TABLE
(WRITE CYCLE)

| CAM BIT | SL | nSL |
|---|---|---|
| L | 0 | 1 |
| H | 1 | 0 |
| X | 0 | 0 |
| $\overline{X}$ | 1 | 1 |

SEARCH LINE STATE TABLE
(MATCH CYCLE)

MEMORY DEVICE AND METHOD OF REFRESHING

CROSS-REFERENCE TO RELATED APPLICATION(S)

The present disclosure is related to U.S. patent application Ser. No. 12/167,823, filed on an even date herewith and entitled "MEMORY DEVICE AND METHOD," the entirety of which is incorporated by reference herein.

BACKGROUND

1. Field of the Disclosure

The present disclosure is related to devices having memory and more particularly to devices have thyristor based memory.

2. Description of the Related Art

Content addressable memories (CAMs) are typically area intensive. A typical CAM uses a Ternary CAM cell requiring as many as 16 transistors. Therefore, a CAM that overcomes this problem would be useful.

BRIEF DESCRIPTION OF THE DRAWINGS

The present disclosure may be better understood, and its numerous features and advantages made apparent to those skilled in the art by referencing the accompanying drawings.

DETAILED DESCRIPTION

Figure 1:
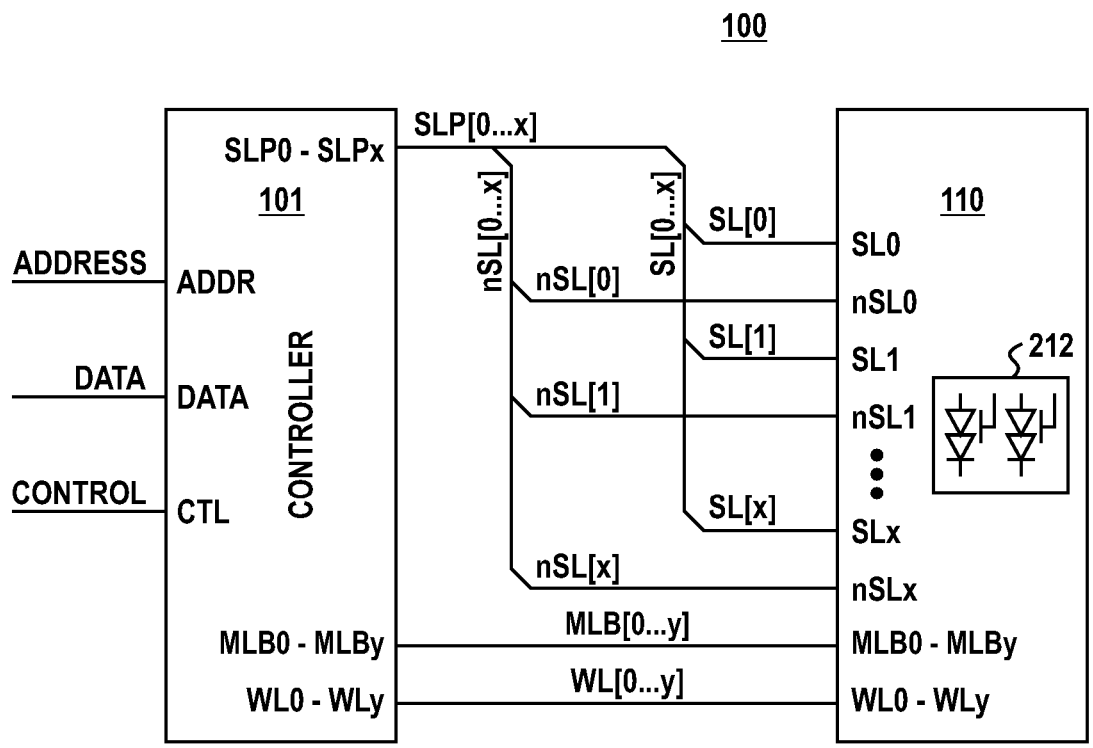
FIG. 1 illustrates in block diagram form a portion of a device including a content addressable memory in accordance with a specific embodiment of the present disclosure.

FIG. 1 illustrates a portion of a device 100. Device 100 can be an integrated semiconductor device, a device including an integrated semiconductor device, and the like. Device 100 includes a controller 101 and a Content Addressable Memory 110 (CAM 110). Controller 101 is connected to interconnects labeled ADDRESS, interconnects labeled DATA, interconnects labeled CONTROL, interconnects labeled SLP[0 ... x], interconnects labeled MLB[0 ... y], and interconnects labeled WL[0 ... y]. CAM 110 is connected to the interconnects SLP[0 ... x], interconnects labeled MLB[0 ... y], and interconnects labeled WL[0 ... y], where "x" and "y" represent integers. CAM 110 includes a CAM storage cell 212, which is discussed in great detail herein.

Figure 2:
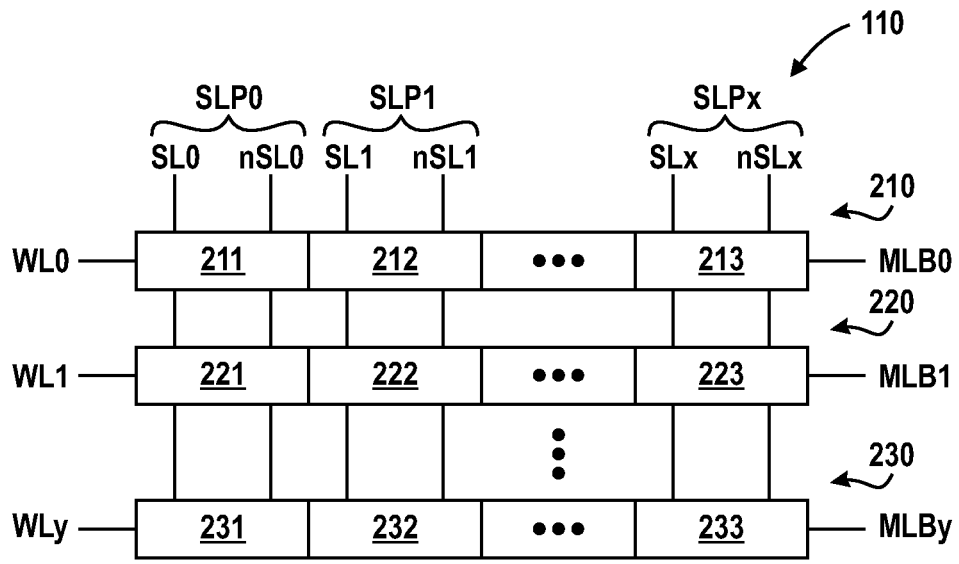
FIG. 2 illustrates in block diagram form the content addressable memory of FIG. 1 in greater detail in accordance with a specific embodiment of the present disclosure.

FIG. 2 illustrates a specific embodiment of CAM 110 in greater detail. The CAM of FIG. 2 includes y+1 word storage locations including word storage locations 210, 220, and 230, collectively referred to as storage locations 210-230. Each of the storage locations 210-230 represents a CAM word that includes an array of x+1 CAM cells, during operation, each CAM cell operates to store a CAM bit. Therefore, each CAM word is represented by x+1 CAM bits. Word storage location 210 includes CAM cells 211-213 and is connected to search lines SLP0-SLPx, to write line WL0, and to match line MLB0. Word storage location 220 includes CAM cells 221-223 and is connected to search lines SLP0-SLPx, to write line WL1, and to match line MLB1. Word storage location 230 includes CAM cells 231-233 and is connected to search lines SLP0-SLPx, to write line WLy, and to match line MLBy.

Figures 3, 4, 5:
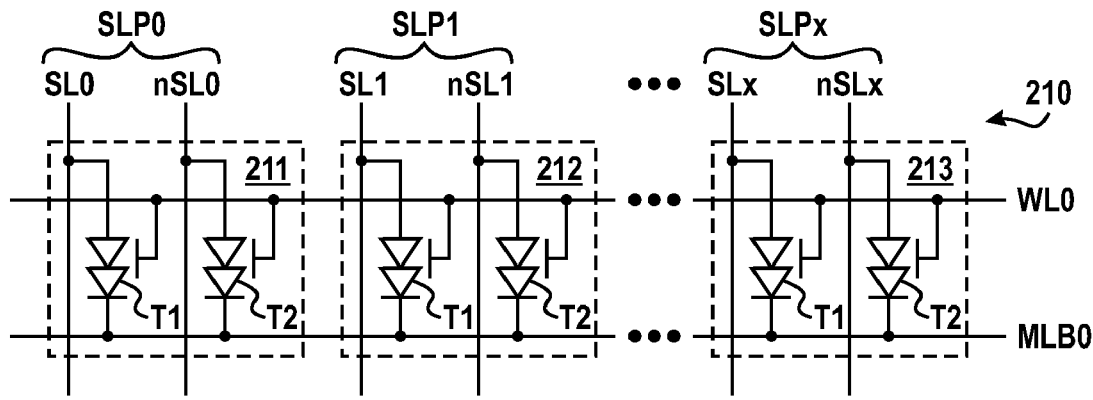
FIG. 3 illustrates in block diagram form a storage location of the content addressable memory of FIG. 2 in greater detail in accordance with a specific embodiment of the present disclosure.
FIG. 4 illustrates in tabular form bit information as it relates to the storage states of a CAM cell of FIG. 3 in accordance with a specific embodiment of the present disclosure.
FIG. 5 illustrates in tabular form bit information as it relates to signals received at a CAM cell of FIG. 3 during a write cycle to place the CAM cell in the storage states indicated at FIG. 4.

FIG. 3 illustrates a specific embodiment of word storage location 210 in greater detail. Word storage location 210 is representative of each of the word storage locations of CAM 110. As illustrated at FIG. 3, word storage location 210 includes an array of thyristors, whereby each CAM cell of storage location 210 respectively includes two thyristors, one labeled T1 and the other labeled T2. The thyristors T1 and T2 can be associated with a thyristor based random access memory (TRAM) technology, such as TCCT DRAM, technology. Each CAM cell's thyristor T1 is configured as a memory cell, also referred to as a thyristor memory cell, and includes a current electrode connected to a corresponding search line of the search lines SL0-SLx, a current electrode connected to match line MLB0, and a control electrode connected to write line WL0. Each CAM cell's thyristor T2 is configured as a memory cell, also referred to as a thyristor memory cell, and includes a current electrode connected to a corresponding search line of the search lines nSL0-nSLx, a current electrode connected to match line MLB0, and a control electrode connected to write line WL0.

Referring to FIG. 1, controller 101 represents a memory controller that can receive address information, data, and control information from other portions of device 100 and based upon this information can perform read and write accesses to the word locations of CAM 110. Memory controller 101 can also perform match detect operations to determine if a word represented by information at the interconnects SLP[0 . . . x], referred to as a search word, matches information stored at any word location of CAM 110, referred to as a stored word.

Controller 101 is configured to store CAM bits at CAM 110. A CAM bit, as used herein, can be a don't care bit or a data bit. A data bit as used herein represents a logic high bit (H) or a logic low bit (L). A don't care bit as used herein represents a don't care match bit (X), or a don't care mismatch bit ($\overline{X}$). In alternate embodiment's controller 101 can be configured to store only certain CAM bits. For example, controller 101 can be configured to store only data bits, or configured to store only data bits and the don't care match bit.

A don't care mismatch bit ($\overline{X}$) as referred to herein is intended to refer to a CAM bit that, with respect to a compare operation, is considered neither a logic high bit nor a logic low bit, and therefore a mismatch will always occur when a don't care mismatch bit is compared to a data bit. A don't care match bit (X) as referred to herein is intended to refer to a CAM bit that, with respect to a compare operation, is considered both a logic high bit and a logic low bit, and therefore a match will always occur when a don't care match bit is compared to a data bit. With respect to the specific embodiment illustrated herein, the don't care match bit has a higher priority than the don't care mismatch bit during a match detect operation, whereby a match will be detected when a don't care match bit is compared to a don't care mismatch bit.

FIG. 4 illustrates a CAM Cell State Table that includes four rows corresponding to the four possible CAM bits, see column 1, that can be stored at a CAM cell. Column 2, labeled T1, indicates whether thyristor T1 of a CAM cell is conductive (C) or non-conductive (NC) when the CAM bit indicated at column 1 is stored at the CAM cell. Column 3, labeled T2, indicates whether thyristor T2 of a CAM cell is conductive (C) or non-conductive (NC) when the CAM bit indicated at column 1 is stored. For example: the row labeled "L" at column 1 of the CAM Cell State Table indicates that during operation a CAM cell represents a stored logic low data bit in response to the CAM cell's thyristor T1 being conductive and its thyristor T2 being non-conductive; the row labeled "H" at the CAM Cell State Table indicates that during operation a CAM cell represents a stored high data bit in response to the CAM cell's thyristor T1 being non-conductive and its thyristor T2 being conductive; the row labeled "X" at the CAM Cell State Table indicates that during operation a CAM cell represents a stored high data bit in response to the CAM cell's thyristor T1 being non-conductive and its thyristor T2 being non-conductive; the row labeled "$\overline{X}$" at the CAM Cell State Table indicates that during operation a CAM cell represents a stored high data bit in response to the CAM cell's thyristor T1 being conductive and its thyristor T2 being conductive.

FIG. 5 illustrates a Search Line State Table for a Write Cycle that indicates the voltage levels provided to the search line pair (SLP) of each CAM cell, i.e., each CAM cell's search lines (SL and nSL), by the controller 101 during a write cycle, where the voltage levels represent a given CAM bit that can be stored at the CAM cell. Column 1 identifies each of the four CAM bits as described above. Column 2, labeled "SL," indicates whether a high voltage level, such as Vdd, or a low voltage level, such as ground, is provided to thyristor T1 during a write cycle that stores the corresponding CAM bit indicated at column 1. Column 3, labeled "nSL" indicates whether a high voltage level or a low voltage level is provided to thyristor T2 during a write cycle that stores the corresponding CAM bit indicated at column 1. As indicated at the row labeled "L" of the table of FIG. 5, when the CAM bit being stored at a CAM cell is a logic low bit, the select line SL, which is connected to thyristor T1 of the CAM cell being programmed, is driven to a high voltage level and the select line nSL, which is connected to thyristor T2 of the CAM cell being programmed, is driven to a low voltage level. As indicated at the row labeled "H" at the Search line State Table (Write Cycle), when the CAM bit being stored at a CAM cell is a logic high bit, the select line SL is driven to a low voltage level and select line nSL is driven to a high voltage level. As indicated at the row labeled "X" at the Search line State Table (Write Cycle), when the CAM bit being stored at a CAM cell is a don't care match bit, the select line SL is driven to a low voltage level and the select line nSL is driven to a low voltage level. As indicated at the row labeled "$\overline{X}$" at the Search line State Table, when the CAM bit being stored at a CAM cell is a don't care mismatch bit, the select line SL is driven to a high voltage level and select line (nSL) is driven to a high voltage level.

Figures 6, 7:
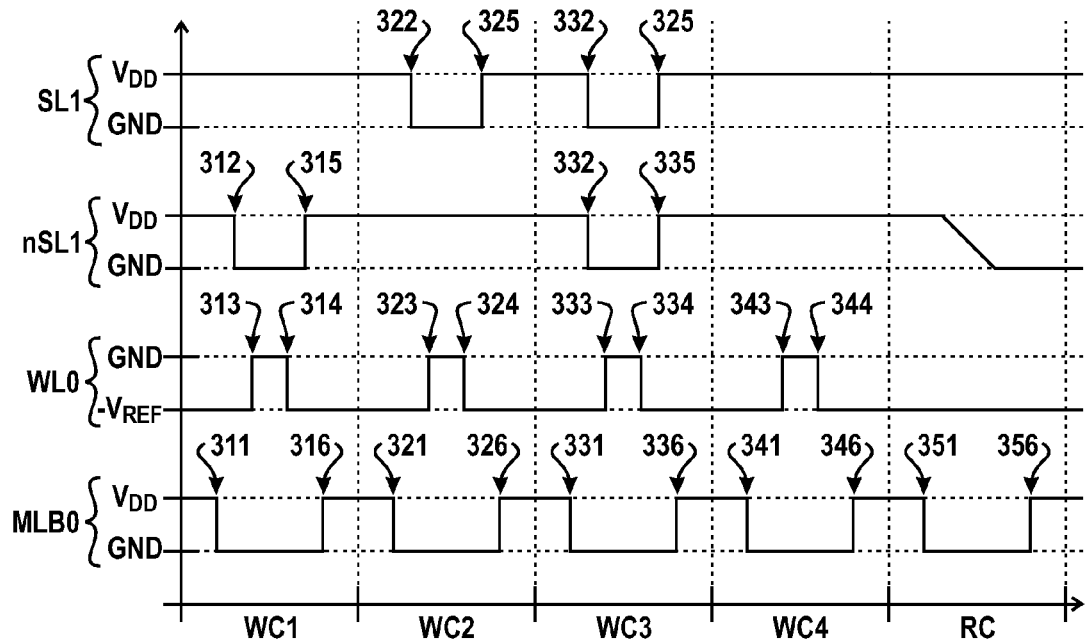
FIG. 6 illustrates a timing diagram illustrating a plurality of write cycles and a read cycle in accordance with a specific embodiment of the present disclosure.
FIG. 7 illustrates in tabular form bit information as it relates to signals received at a CAM cell of FIG. 3 during a match cycle that are to be compared to stored information.

FIG. 6 illustrates a timing diagram that includes a write cycles WC1-WC4, and read cycle RC for CAM cell 212. At the beginning of write cycle WC1 interconnects SL1, nSL1, and MLB0 are at a high voltage level, such as Vdd, and interconnect WL0 is at a low voltage level −Vref, such as −0.5 volts. Interconnect MLB0 is driven to a low voltage level, such as ground, at time 311, interconnect nSL1 is driven to a low voltage level, such as ground, at time 312, interconnect WL0 is driven to a high voltage level, such as ground, at time 313, interconnect WL0 is driven to its low voltage level at time 314, interconnect nSL1 is driven to a high voltage level signal at time 315, and interconnect MLB0 is driven to a high voltage level signal at time 316. In response to write cycle WC1, thyristor T1 of CAM cell 212 is placed in a conductive state and thyristor T2 of CAM cell 212 is placed in a non-conductive state during the time period from time 313 to 314.

FIG. 6 illustrates a write cycle WC2 that illustrates a logic high bit being written to CAM cell 212. At the beginning of write cycle WC2 interconnects SL1, nSL1, WL0 and MLB0 are driven the same as at the beginning of WC1. Interconnect MLB0 is driven to the low voltage level at time 321, interconnect SL1 is driven to a low voltage level at time 322, interconnect WL0 is driven to a high voltage level at time 323, interconnect WL0 is driven to a low voltage level at time 324, interconnect SL1 is driven to a high voltage level signal at time 325, and interconnect MLB0 is driven to a high voltage level signal at time 326. In response to write cycle WC2, thyristor T1 of CAM cell 212 is placed in a non-conductive state and thyristor T2 of CAM cell 212 is placed in a conductive state.

FIG. 6 illustrates a write cycle WC3 that illustrates a don't care match bit being written to CAM cell 212. At the beginning of write cycle WC3 interconnects SL1, nSL1, WL0 and MLB0 are driven the same as at the beginning of WC1. Interconnect MLB0 is driven to the low voltage level at time 331, interconnects SL1 and nSL1 are driven to a low voltage level at time 332, interconnect WL0 is driven to a high voltage level at time 333, interconnect WL0 is driven to a low voltage level at time 334, interconnects SL1 and nSL1 are driven to a high voltage level at time 335 and interconnect MLB0 is driven to a high voltage level signal at time 346. In response to write cycle WC3, thyristor T1 of CAM cell 212 is placed in a non-conductive state and thyristor T2 of CAM cell 212 is placed in a non-conductive state.

FIG. 6 illustrates a write cycle WC4 that illustrates a don't care mismatch bit ($\overline{X}$) being written to CAM cell 212. At the beginning of WC4 interconnects SL1, nSL1, WL0 and MLB0 are driven the same as at the beginning of WC1. Interconnect MLB0 is driven to the low voltage level at time 341, interconnect WL0 is driven to a high voltage level at time 343, interconnect WL0 is driven to a low voltage level at time 344, and interconnect MLB0 is driven to a high voltage level signal at time 346. In response to write cycle WC4, thyristor T1 of CAM cell 212 is placed in a conductive state and thyristor T2 of CAM cell 212 is placed in a conductive state.

FIG. 7 illustrates a Search Line State Table for a Match Cycle that indicates the voltage levels provided to the search line pairs of each CAM cell by the controller 101 during a match cycle, where the voltage levels represent a given CAM bit that can be stored. With respect to the columns of the table of FIG. 7, column 1 identifies each possible CAM bit. Columns 2 and 3, labeled "SL" and "nSL", contain the values of "1" and "0" respectively indicate whether a high voltage level, such as Vdd, or a low voltage level, such as ground, is provided to thryristors T1 and T2 of a CAM cell via select lines SL and nSL, respectively, during a match cycle. It is to be noted that during a match cycle, e.g., a match detect operation, a data bit is represented at a search line pair using voltage levels that are complementary to the voltage signals used to represent the data bit at the search line pair when being stored at a CAM cell. For example, while SL1 and nSL1 are driven to a high and a low voltage level, respectively, to represent a logic low bit during a write operation to CAM cell 212, see FIG. 5, SL1 and nSL1 are driven to a low and a high voltage level, respectively, to represent a logic low bit during a match detect operation. Similarly, while SL1 and nSL1 are driven to a low and a high voltage level, respectively, to represent a logic high bit during a write operation to CAM cell 212, SL1 and nSL1 are driven to a high and a low voltage level, respectively, to represent a logic high bit during a match detect operation.

During a match detect operation, a don't care bit is represented at a search line pair using voltage signals that are the same as the voltage signals used to represent that don't care bit during write operation.

Figure 8:
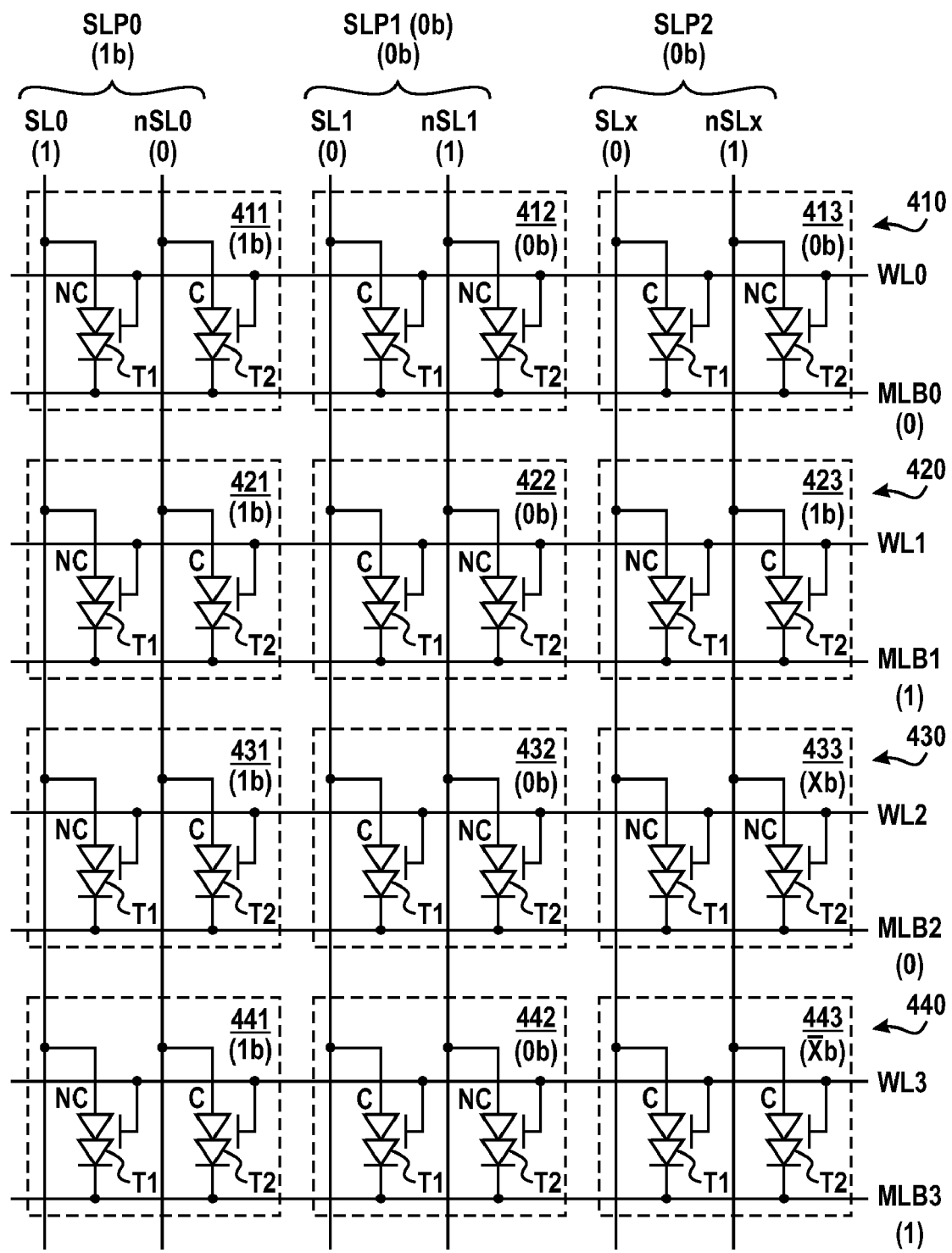
FIG. 8 illustrates in block diagram form a portion of a content addressable memory during a match cycle.
Figure 9:
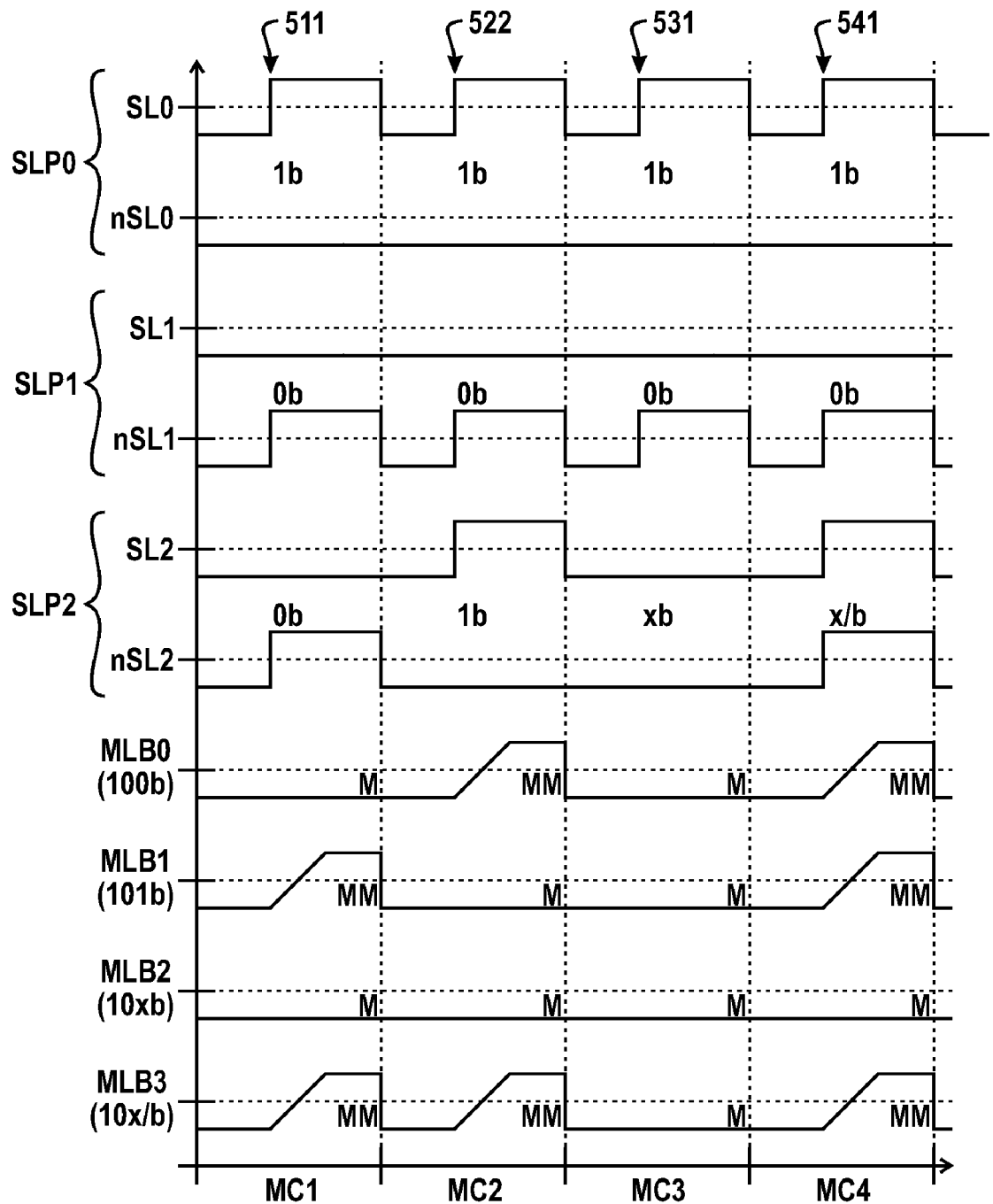
FIG. 9 illustrates a timing diagram illustrating a plurality of match cycles.

FIG. 8 represents a portion of CAM memory 110 during a match cycle MC1 as illustrated at FIG. 9. FIG. 8 illustrates word storage locations 410, 420, 430, and 440 of a CAM memory during a match detect operation. The four word storage locations 410, 420, 430, and 440 are collectively referred to as word storage locations 410-440, or a CAM word. Each of the CAM words 410-440 includes an array of three CAM cells and therefore can store words having three CAM bits. Each respective CAM cell of a CAM word is connected to corresponding search line pair of search line pairs SLP0-SLP2.

The CAM bit being driven at each search line pair of FIG. 8 is indicated parenthetically under each respective bit line pair label. For example, the CAM bit being driven at SLP0 is 1*b*, the CAM bit being driven at SLP1 is 0*b*, and the CAM bit being driven at SLP2 is 0*b*. The suffix "b" as used with respect to a search line, a search word, a CAM cell, or a stored word at a CAM memory is used to indicate that each digit preceding the suffix b respectively represents a corresponding CAM bit. A 0*b* corresponds to a logic low bit (L) and a 1*b* corresponds to a logic high bit (H). Therefore, FIG. 8 illustrates a search word 100*b* at search line pairs SLLP0-SLP2.

A specific CAM bit being driven at a search line pair during a match detect operation is encoded as signals at search lines SL and nSL of the search line pair as indicated at the table of FIG. 7. For example, a search line pair being driven with CAM bit 1*b* during a match operation, such as bit line pair SLP0 at FIG. 8, will have its search line SL driven to a high voltage level while its search line nSL0 is driven to a low voltage level. For example, referring to search line pair SLP0 of FIG. 8, search line SL0 is indicated parenthetically by designator "1" to be driven to a high voltage level, and search line nSL0 is indicated parenthetically by designator "0" to be driven to a low voltage level.

The conductivity of each CAM cell's thyristors are indicated at each CAM cell of FIG. 8 by the designators "C" and "NC", where designator "C" at a thyristor of FIG. 8 indicates it is programmed to be conductive, and designator "NC" at a thyristor indicates it is programmed to be non-conductive. Therefore, based upon the program state of each CAM cell of FIG. 8 and the encoding information at the table of FIG. 4, the following words are stored at CAM storage locations 410-440: storage location 410 stores word 100*b*; word storage location 420 stores word 101*b*; storage location 430 stores word 10X*b*; and storage location 440 stores word 10X̄*b*. For example, word storage location 430 stores word 10X*b* as follows: with respect to CAM cell 431 of storage location 110, thyristor T1 is conductive and thyristor T2 is non-conductive, therefore, based upon the encoding illustrated at Table 4, the CAM bit stored at CAM cell 431 is a logic high bit as indicated parenthetically at reference number 431 by designator 1*b*; with respect to CAM cell 432 thyristor T1 is non-conductive and thyristor T2 is conductive, and, therefore, based upon the encoding illustrated at Table 4, the CAM bit stored at CAM cell 432 is a logic low bit as indicated parenthetically at reference number 432 by designator 0*b*; at CAM cell 433 thyristor T1 is non-conductive and thyristor T2 is conductive, and, therefore, based upon the encoding illustrated at Table 4, the CAM bit stored at CAM cell 432 is a don't care match bit as indicated parenthetically at reference number 432 by designator X*b*. A don't care mismatch bit, such as at CAM cell 443, is stored at a CAM cell when both thyristors T1 and T2 of the CAM cell are conductive and is indicated by the designator X̄*b*.

FIG. 9 illustrates a timing diagram illustrating match cycles MC1-MC4. Match cycle MC1 is based upon the state of the portion of CAM memory illustrated at FIG. 8. At the beginning of each write cycle WC0-WC4, the search lines (SL and nSL) of each search line pair SLP0-SLP2 are illustrated at FIG. 9 to be driven to a low voltage level, the four word lines WL0-WL3 (not shown) are driven to a hold voltage ($V_{Hold}$), and each of the four match lines MLB0-MLB3 are precharged to the low voltage level. At time 511 of the match cycle MC1 a search data word is asserted at the search lines of the search line pairs SLP0-SLP1. For example, at time 511 of MC1 a search word of 100*b* is provided to search line pairs SLP0-SLP2 as indicated at FIG. 9, and shown parenthetically at FIG. 8.

In response to a search word being asserted at time 511 of match cycle MC, a low current signal will be provided at each match line that is connected to a word that stores the search line word, and a high-current signal will be provided at each match line that is connected to a word that does not store the search line word. It will be appreciated that a low-current signal at a match line results in the match line remaining at a low-voltage level, and that a high-current signal at a match line results in the match line transitioning to a high-voltage level.

Referring to FIG. 8, the search word 100*b* driven at interconnects SLP0-SLP2 during the match cycle MC1 of FIG. 9 is illustrated, and results in a low current signal being asserted at MLB0, indicated parenthetically below the label MLB0 of FIG. 8 by designator "0", which indicates a match has occurred between the search word and the word stored at storage location 410. Specifically: the high voltage level at search line SL0 of CAM cell 411 of FIG. 8 does not contribute any significant current to match line MLB0 in response to SL0 being driven high because the thyristor T1 is non-conductive, and no significant current is provided to MLB0 in response to nSL0 being driven low at CAM cell 411, even though the thyristor T1 is conductive, since search line nSL0 and the match line ML0 are at the same low voltage level; no significant current is provided to MLB0 in response to nSL0 being driven low at CAM cell 411, even though the thyristor T1 is conductive, since search line SL1 and the match line ML0 are at the same low voltage level, and the high voltage level at search line nSL1 does not contribute any significant current to match line MLB0 in response to nSL1 being driven high because the thyristor T2 is non-conductive; CAM cell 413 provides no significant current to MLB0 as it operates in the same manner during match cycle MC1 as CAM cell 412. Referring to the timing diagram of FIG. 9, match line MLB0 is illustrated as remaining at a low-voltage level, indicative of a match (M) during MC1.

The search word 100b driven at interconnects SLP0-SLP2 during the match cycle MC1 of FIG. 9 results in a high-current signal being asserted at MLB1, indicated parenthetically below the label MLB1 of FIG. 8 by designator "1", which indicates a mismatch has occurred between the search word, 100b, and the stored word, 101b, at storage location 412. Specifically, CAM cell 421 stores the same CAM bit as CAM cell 411 previously described and, therefore, does not contribute any significant current to match line MLB1 during match cycle MC1; CAM cell 422 stores the same CAM bit as CAM cell 412 previously described and, therefore, does not contribute any significant current to match line MLB1 during match cycle MC1; CAM cell 423 of FIG. 9, however, does provide significant current to MLB1 during match cycle MC1. Current through flow through CAM cell 423 is as follows: no significant current is provided through thyristor T1 because both of its current electrodes are at the same voltage, and because it is non-conductive; thyristor T2 is conductive and conducts current from the high voltage level at search line SL2 to the low-voltage level at MLB1.

It will be appreciated that the high current through a thyristor, which is indicative of a mismatch, can cause the precharged match line, such as MLB1, to transition to a high voltage level, as indicated at FIG. 9, that can be sensed by a sense module. Alternatively, the high current through a thyristor can be detected by a sense module that detects current (not shown), whether or not the voltage at the match line changes significantly.

The search word 100b driven at interconnects SLP0-SLP2 during the match cycle MC1 of FIG. 9 results in a low-current signal being asserted at MLB2, indicated parenthetically below the label MLB2 of FIG. 8 by designator "0", which indicates a match has occurred between the search word, 100b, and the stored word, 10Xb, at storage location 413. Specifically, CAM cell 431 stores the same CAM bit as CAM cell 411 previously described and, therefore, does not contribute any significant current to match line MLB1 during match cycle MC1; CAM cell 432 stores the same CAM bit as CAM cell 412 previously described and, therefore, does not contribute any significant current to match line MLB1 during match cycle MC1; CAM cell 433, which stores a don't care match bit (X), provides no significant current since thyristor T1 and thyristor T2 of CAM cell 433 are both non-conductive, thereby preventing significant current flow to match line MLB1 regardless of a voltage level at the search line pair SLP2. Referring to the timing diagram of FIG. 9, match line MLB2 is illustrated as remaining at a low-voltage level, indicative of a match (M) during MC3.

The search word 100b driven at interconnects SLP0-SLP2 during the match cycle MC1 of FIG. 9 results in a high-current signal being asserted at MLB3, indicated parenthetically below the label MLB3 of FIG. 8 by designator "1", which indicates a mismatch has occurred between the search word, 100b, and the stored word, 10$\overline{X}$b, at storage location 414. Specifically, CAM cell 441 stores the same CAM bit as CAM cell 411 previously described and, therefore, does not contribute any significant current to match line MLB3 during match cycle MC1; CAM cell 442 stores the same CAM bit as CAM cell 412 previously described and, therefore, does not contribute any significant current to match line MLB3 during match cycle MC1; CAM cell 443, which stores a don't care mismatch bit (X/), however, provides significant current to MLB3 since thyristor T1 and thyristor T2 of CAM cell 413 are both conductive, thereby allowing current flow through thyristor T2 in response to search line nSL2 being driven to a high voltage value at time 511. Referring to the timing diagram of FIG. 9, match line MLB4 is illustrated as transitioning to a high-voltage level, indicative of a match (MM) during MC1.

As illustrated at FIG. 9, a match cycle MC2 follows match cycle MC1, whereby the words at storage locations 110-140 remain the same. At the beginning of match cycle MC2, the interconnects are driven as described previously with respect to the beginning of match cycle MC1. At time 521 of match cycle MC2 a search word 101b is asserted at the search lines of the search line pairs SLP0-SLP2. As a result, a high-current signal indicative of a mismatch between the search word and information stored at storage locations 410 and 440 of FIG. 8 is provided to match lines MLB0 and MLB3, and a low-current signal indicative of a match between the search word and information stored storage locations 420 and 430 is provided to match liens MLB1 and MLB2.

Match cycle MC3 follows match cycle MC2. At the beginning of match cycle MC3, the interconnects are driven as described previously with respect to the beginning of match cycle MC1. At time 531 of match cycle MC3 a search word 10Xb is asserted at the search lines of the search line pairs SLP0-SLP2. Since search line pair SLP2 represents a don't care match state, whereby a low voltage level is driven at search lines SL2 and nSL2, none of the CAM cells 413, 423, 433, and 443 provide any significant current to their corresponding match lines, which are also at the low voltage level. Therefore, a low-current signal indicative of a match between the search word and information stored at storage locations 410, 420, 430, and 440 is provided to match lines MLB0-MLB3.

Match cycle MC4 follows match cycle MC3. At the beginning of match cycle MC3, the interconnects are driven as described previously with respect to the beginning of match cycle MC1. At time 541 of match cycle MC4 a search word 10$\overline{X}$b is asserted at the search lines of the search line pairs SLP0-SLP2. Since search line pair SLP2 represents a don't care mismatch state, any CAM cell storing data bits, i.e., CAM cells 413 and 423 of FIG. 9, and any CAM cell storing a don't care mismatch bit, i.e. CAM cell 443, will provide significant current to its corresponding match line through conducting thyristors. Therefore, a high-current signal indicative of a mismatch between the search word and words stored at storage locations 410, 420, and 440 is provided to match lines MLB0, MLB1, and MLB3. However, since CAM cell 433 stores a don't care match bit, both of its thyristors, T1 and T2, are non-conductive to prevent significant current from being provided to the match line MLB3 through CAM cell 433. Therefore, a low-current signal indicative of a match between the search word and information stored storage location 430 is provided to match line MLB2.

Figure 10:
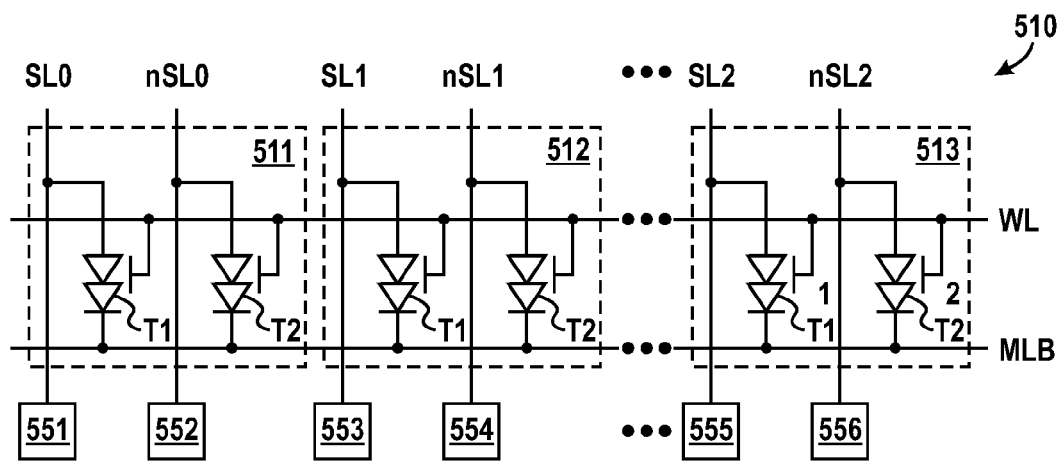
FIG. 10 illustrates a specific embodiment of a content addressable memory having sense modules connected to each search line of a storage word.

FIG. 10 illustrates a specific embodiment of a device, such as device 100 of FIG. 1, whereby each search line of a CAM array is connected to a corresponding sense module of sense modules 551-556 to facilitate reading a word stored at a storage location, such as storage location 510, which includes CAM cells 511-513. The state of each thyristor, of storage location 510, such as thyristor T1, can be determined simultaneously during a read cycle RC as indicated at FIG. 6. At the beginning of read cycle RC, the search lines SL1 and nSL1 of search line pair SLP1 are precharged to a high voltage level, the write line WL0 is driven to a low voltage level, and the match line MLB0 is driven to a high voltage level. At time 351, of the read cycle RC the match line MLB0 is driven low. As a result, a search line will provide a high voltage level at time 356 to the match line, e.g., by maintaining its precharge voltage, if the thyristor the search line is connected to is non-conductive, and will provide a low voltage level at time 356, e.g., by transitioning to a low voltage level, if the thyristor memory cell is conductive. The signals resulting at the respective search lines can be detected by the sense modules 551-556 for each thyristor memory cell.

Figure 11:
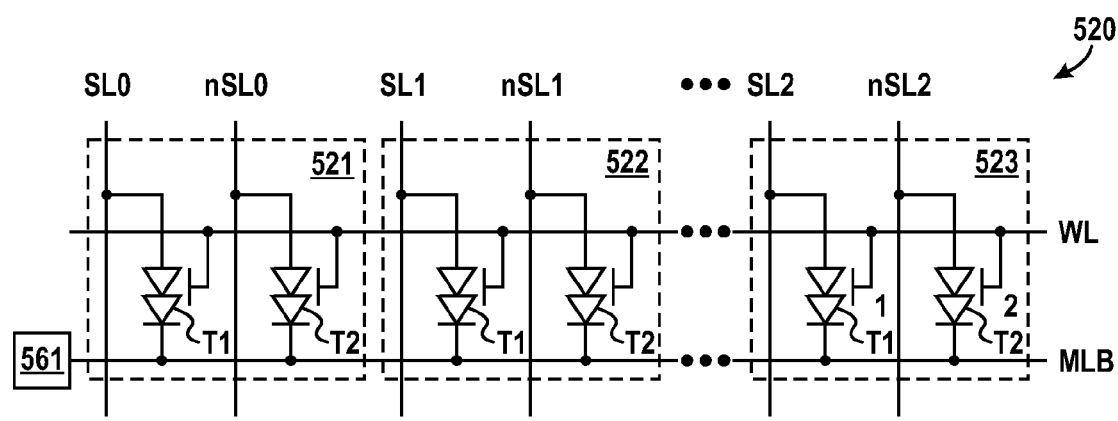
FIG. 11 illustrates a specific embodiment of a content addressable memory having a sense module connected to the match line of a storage word.

FIG. 11 illustrates a specific embodiment of a device, such as device 100 of FIG. 1, whereby the write line of the CAM array 110 is connected to a corresponding sense module 561 to facilitate reading a word stored at a storage location, such as storage location 520, which includes CAM cells 521-523. The state of each thyristor, such as T1, can be determined one at a time by serially reading each thyristor during a read cycle. Prior to reading information stored at each thyristor, the match line MLB is precharged to a low voltage level, the write line WL is driven to the hold voltage, and the search lines are driven to a low voltage. Once MLB is precharged, the search line of the thyristor being read is driven to a high voltage level. As a result, the match line will provide the high voltage level to the match line if the thyristor being read is conductive, and will provide the low voltage level to the match line by maintaining the precharge voltage if the thyristor memory cell is not conductive. The signal resulting at the match line can be detected by the sense module 561, before being repeated for each other thyristor of the storage location 520.

Figure 12:
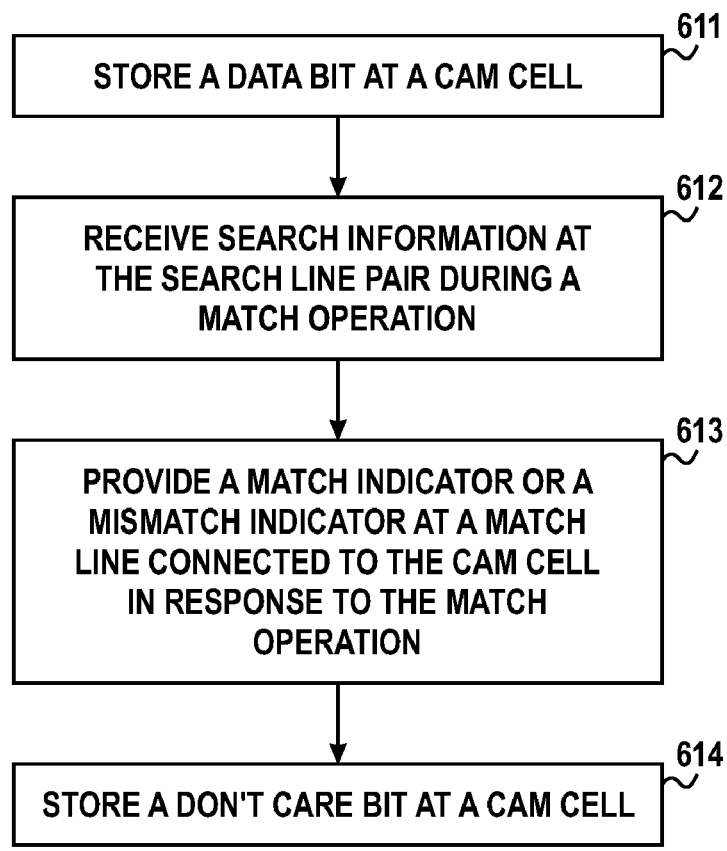
FIG. 12 illustrates a method in accordance with a specific embodiment of the present disclosure.

FIG. 12 illustrates a method in accordance with the present disclosure. At block 611, a data bit is stored at a CAM cell. For example, referring to CAM cell 212 of FIG. 3, during a write operation to word storage location 210, thyristor T1 is placed in a conductive state and thyristor T2 is placed in a non-conductive state in response to information at the search line pair (SL1, nSL1) representing a low data bit. Alternatively, in response to information at the interconnects SL1, nSL1, of CAM 110 representing a high data bit, thyristor T1 would placed in a non-conductive state and thyristor T2 would be placed in a conductive state during the write operation, thereby storing a low data bit at CAM cell 212.

At block 612, as part of a match detection operation, information representing a data word is received at the search line pairs associated with word storage location 210. For example, information representing a data bit during a match operation as indicated at FIG. 7 is provided to the search line pair of CAM cell 212 as part of a match detection operation that will determine whether information representing a search word received at the CAM 110 is stored at a word of CAM 110. As illustrated previously, SL1 is connected to a current electrode of thyristor T1 and nSL1 is connected to a current electrode of thyristor T2.

At block 613, in response to a match detection operation, a match indicator that indicates a match occurred between the data bit represented at the first search line pair and the data bit represented at the CAM cell corresponding to the first search line pair is provided to a match line or a mismatch indicator that indicates a match did not occur between the data bit represented at the first search line pair and the data bit represented at the CAM cell corresponding to the first search line pair is provided to a match line. For example, with respect to CAM cell 212, if information is received at its search lines representing a high data bit, e.g., a high voltage level at SL1 and a low voltage level nSL1, and the state of CAM cell 212 also represents a high data bit, e.g., T1 non-conductive and T2 conductive, a low voltage signal indicating a match occurred will be provided at MLB0 in response to a match detection operation, assuming matches occur between each other CAM cell of word 210 at its respective corresponding search line pair. As previously discussed, the low voltage signal indicating a match can be provided by maintaining a low voltage precharge state. Alternatively, a high voltage signal would be provided at the match line MLB0 to indicate a mismatch occurred if the state of CAM cell 212 represented a low data bit.

At block 614, information representing a don't care state is stored at the CAM cell. For example, referring to CAM cell 212 during a write operation to word 210 of FIG. 3, thyristor T1 is placed in a non-conductive state and thyristor T2 is placed in a non-conductive state in response to information at the search line pair (SL1, nSL1) representing a don't care match state. Alternatively, during a write operation to word 210 thyristor T1 is placed in a conductive state and thyristor T2 is placed in a conductive state in response to information at the search line pair (SL1, nSL1) representing a don't care mismatch state. It will be appreciated that in other embodiment, the controller that controls reading and writing information to a CAM cell need not support don't care data as indicated at block 614.

Figure 13:
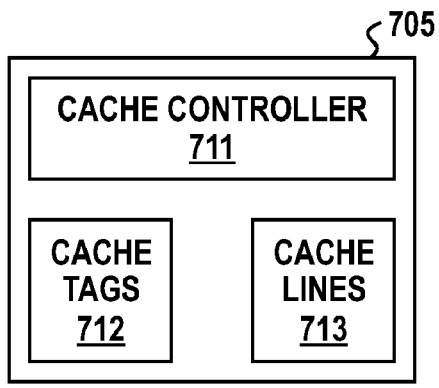
FIG. 13 illustrates a cache in accordance with a specific embodiment of the present disclosure.

FIGS. 13-17 disclose various implementations of a cache using CAM cells as described herein. For example, FIG. 13 illustrates a device 700 that includes an integrated circuit device 705 that includes a cache having a cache controller 711, cache tags 712, and cache lines 713. The cache tags 712 are formed using a content addressable memory as described herein.

Figure 14:
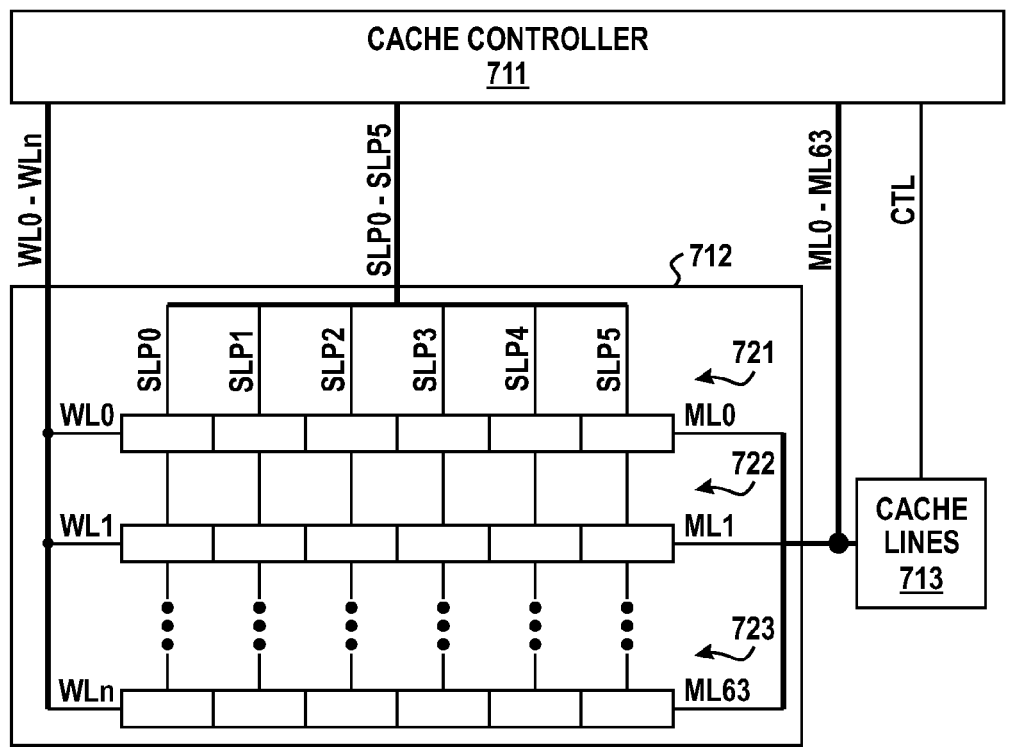
FIG. 14 illustrates a fully-associative cache in accordance with a specific embodiment of the present disclosure.

FIG. 14 illustrates a specific embodiment of a fully-associative cache, whereby a tag associated with any location in a memory can be stored at the tag of any cache line. Based upon the disclosure herein, each tag location of tag locations 721-723, is illustrated as having six CAM cells, and can be accessed simultaneously with each other tag location of tag locations 721-723 to determine whether any tag location store a value that matches a tag value for a current memory location being driven by the cache controller at nodes SLP0-SLP5. If a match occurs, an asserted match indicator will be provided at one of the match lines ML0-ML5 for use by the cache controller 711 to access information stored at a specific cache line the cache lines 713.

Figure 15:
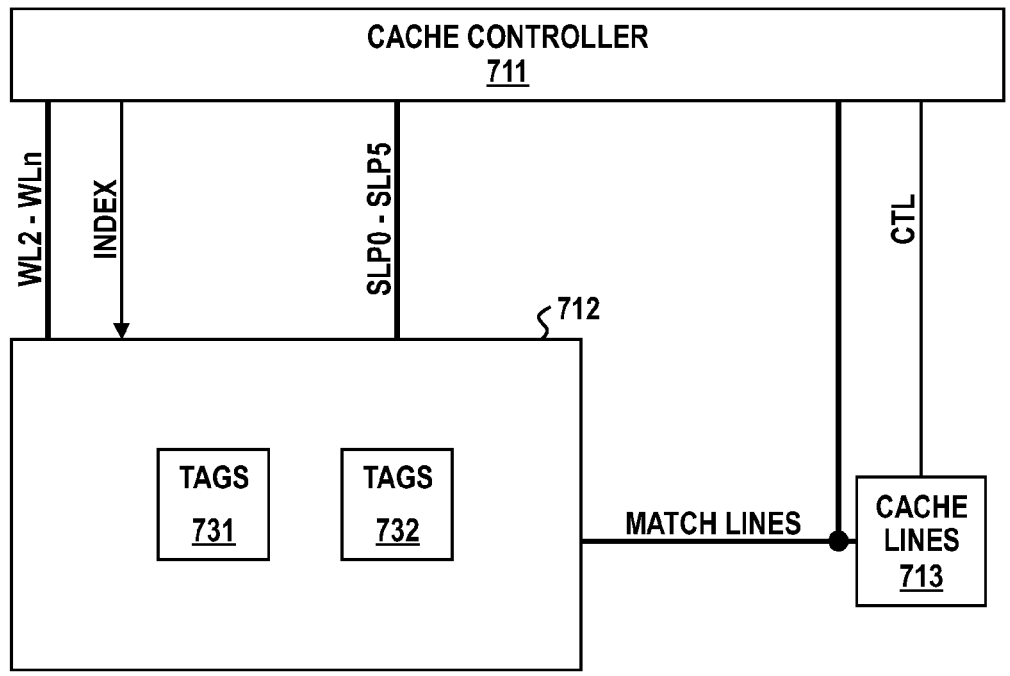
FIG. 15 illustrates a generic set-associative cache in accordance with a specific embodiment of the present disclosure.
Figure 16:
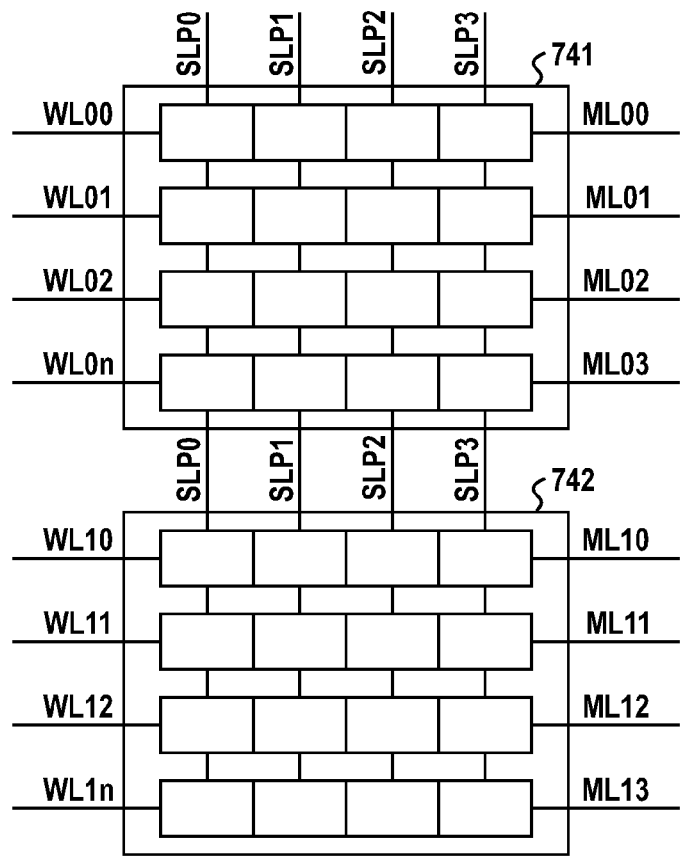
FIG. 16 illustrates a more specific set-associative cache in accordance with a specific embodiment of the present disclosure.
Figure 17:
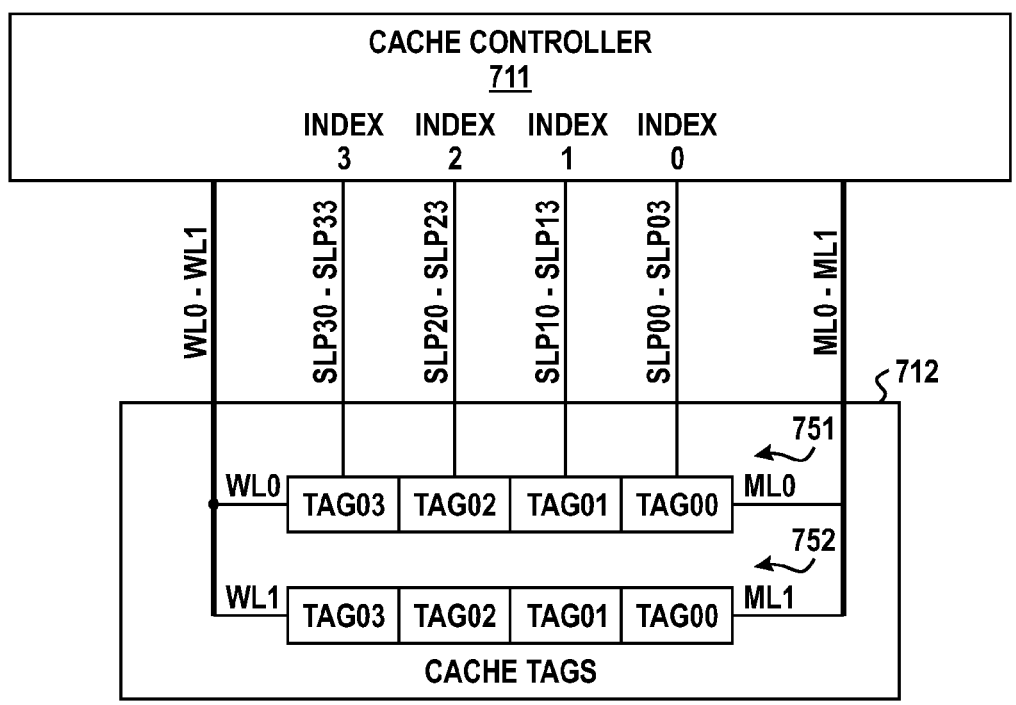
FIG. 17 illustrates a more specific set-associative cache in accordance with a specific embodiment of the present disclosure.

FIG. 15 illustrates a generic set-associative cache, whereby a portion of a current address is used to identify an index value and a portion of a current address is used as a tag. For purposes of illustration, two-bits are used to represent the index and n-3 bits are used to represent a tag value, as opposed to the fully associative cache of FIG. 14, where all n-1 bits are used to represent the tag value. It will be appreciated that a memory location that can be presented at the cache of FIG. 15 can have its tag value be stored at one of two cache tag locations of FIG. 15, i.e., one at each way, that are associated with a common index. For example, tag locations 731 are associated with a first way of the cache 700 and tag location 732 are associated with a second way of the cache 700, wherein each tag location of tags 731 is associated with a corresponding index value of a set of index values, and each of tag locations 732 is associated with a corresponding index value of the set of index values. If during a cache access a match occurs at either tag locations 732 for the index of the address being accessed, a match indicator will be driven at the appropriate match line to indicate to the controller 711 that a match has occurred and to indicate the way where the match occurred. FIGS. 16 and 17 illustrate specific embodiments of set-associated cache tags based upon the CAM cells disclosed herein.

FIG. 16 illustrates a simple example of a set-associative cache having a two-bit index and a four-bit tag. Specifically, the cache controller 711 of FIG. 15 will enable one cache line at way 741 and one cache line at way 742 based upon the two-bit index value by asserting one of four match lines associated with the current index at each way. For example, the match line is driven to a low voltage level at the beginning of the match cycle as described at FIG. 9. Only one match line of each way is enabled to determine a match at a time, while each other match line is negated. Note that separate index lines, as indicated at FIG. 15, are not needed to drive the match lines at ways 741 and 742. Once the match lines associated with an index are enabled, the cache controller 711 will assert a tag value at nodes SLP0-SLP3 to determine if there is a match between the asserted tag value and the tag values stored at either of the two tag locations associated with the enabled match line. If a match occurs at one of the two enabled tag locations, a match indicator will be driven at the corresponding match line to indicate to the controller that the cache contains the data being accessed.

FIG. 17 illustrates another simple example for a set-associative cache having a two-bit index and a four-bit tag. Specifically, more than one tag of a way shares a common match line, and the cache controller will drive the tag value at an output location that corresponds to the index value of a current memory location. Therefore, if the index value is one, for example, the four pairs of interconnects labeled SLP10-SLP13 will be driven with the tag value of a current address to both ways, while the other four pairs of interconnects, SLP00-SLP03, SLP20-SLP23, and SLP30-SLP33, will be driven with don't care CAM bits (X) since they are not selected. In this manner, whether or not the match line associated with a way indicates the occurrence of a match will be based solely upon whether the driven tag value matches the value stored at its corresponding location in memory. Thus, if a match occurs at one of the two indexed locations, a match indicator will be driven at the match line corresponding the way where the match occurs to indicate to the controller that the cache contains the data being accessed.

Figure 18:
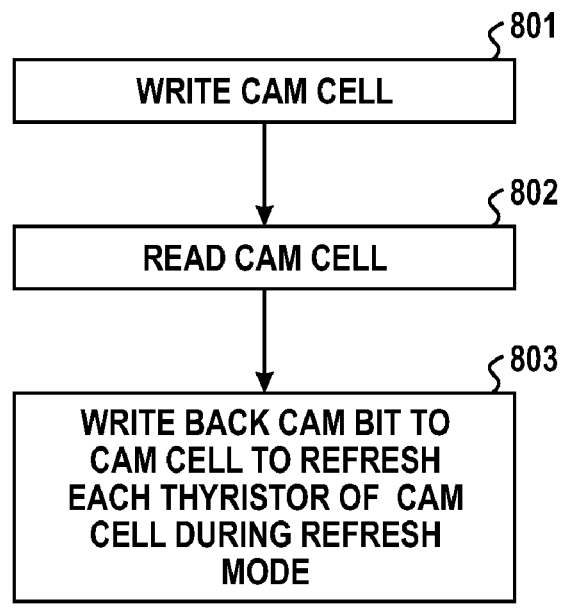
FIG. 18 illustrates flow diagram of a method in accordance with a specific embodiment of the present disclosure.

FIG. 18 illustrates flow diagram for refreshing a CAM cell in accordance with a specific embodiment of the present disclosure. At block 801 a CAM bit is written to a CAM cell as previously described to place each thyristor of the CAM cell in one of a conductive state or a non-conductive state, whereby the conductivity of two thyristors is used to indicate a specific CAM bit. At block 802, as part of a refresh operation, the CAM cell is read during a read-back portion of the refresh operation to determine a CAM bit stored at the CAM cell. Such a read-back can be accomplished based upon either of the two read operations as described previously. At block 803, the CAM bit read from the CAM cell at block 802 is written to the CAM cell as part of a write-back portion of the refresh operation. Therefore, if a thyristor of a CAM cell is determined during the read operation to be conductive, a high-signal level will be placed at its corresponding search line during a write operation to refresh the state of the thyristor. If a thyristor of a CAM cell is determined during the read operation to be non-conductive, a low-signal level will be placed at its corresponding search line during the write operation to refresh the state of the thyristor.

Figure 19:
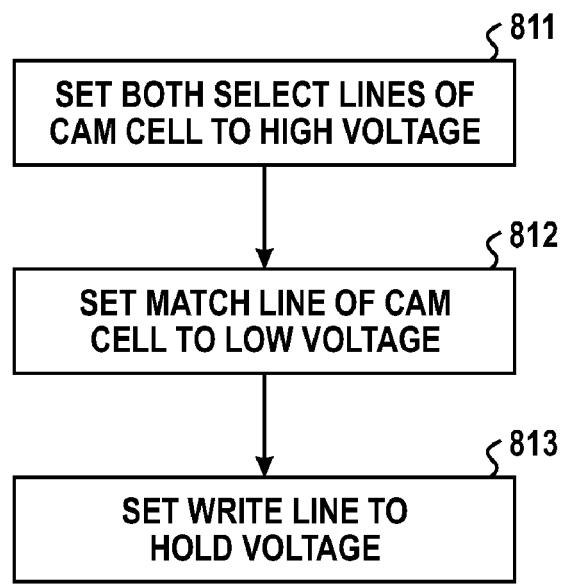
FIG. 19 illustrates flow diagram of a method in accordance with a specific embodiment of the present disclosure.

FIG. 19 illustrates flow diagram for refreshing a CAM cell in accordance with a specific embodiment of the present disclosure. At block 811 both select lines of a CAM cell are driven to a high-voltage level. At block 812, the match line of the CAM cell is driven to a hold voltage that is a low voltage level, such as ground or a negative value, such as −0.2 volts. At block 813 the write line of the CAM cell is set to a low-level voltage such as the hold voltage, such as ground. The storage state of both a conductive and non-conductive thyristor is refreshed by maintaining these voltages for a refresh cycle.

In the foregoing specification, principles of the disclosure have been described above in connection with specific embodiments. However, one of ordinary skill in the art appreciates that one or more modifications or one or more other changes can be made to any one or more of the embodiments without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

What is claimed is:

1. A memory device comprising:
a memory word comprising a plurality of thyristor storage elements, each thyristor storage element comprising a first current electrode to receive a corresponding data bit of a data word during a write cycle, a second current electrode, and a control electrode; and
a control module to place each respective thyristor storage element into a programmed state based upon a corresponding signal level during a write cycle, where the programmed state can be a conductive state or a non-conductive state, and during a refresh mode the control module is to refresh each thyristor storage element of the memory word at the conductive state by providing a high-signal level to the first current electrode of each conductive thyristor while a first low-signal level is provided to the second current electrode of each thyristor at the conductive state.

2. The control module of claim 1 to further refresh each thyristor storage element of the memory word having a thyristor at the non-conductive state by providing a second low-signal level to the first current electrode of each non-conductive thyristor while the first high-signal level is provided to the conductive thyristors and performing a write operation.

3. The device of claim 2 where during the refresh mode the control module reads each respective thyristor storage element of the memory word prior to providing the high-level signal and prior to providing the second low-level signal.

4. The control module of claim 2 to further refresh each thyristor storage element of the memory word by providing a hold signal level to the control electrode of each conductive thyristor and each non-conductive thyristor, the first low-signal level being between the hold signal level and the high-signal level.

5. The device of claim 2, wherein the first low-signal level and the second low-signal level are to be ground voltage levels.

6. The device of claim 2, wherein the first low-signal level is to be a voltage less than a ground voltage level and the second low-signal level is to be the ground voltage level.

7. The control module of claim 1 to further refresh each thyristor storage element of the memory word at the non-conductive state by providing the high-signal level to the first current electrode of each non-conductive thyristor while the first low-signal level is provided to the second current electrode of each non-conductive thyristor.

8. The control module of claim 1 to further refresh each thyristor storage element of the memory word while a hold signal level is provided to the control electrode, the first low-signal level being between the first high-signal level and the hold signal level.

9. The device of claim 1 where during the refresh mode the control module reads each respective thyristor storage element of the memory word prior to providing the high-level signal.

10. A method comprising:
    placing a first thyristor storage element of a memory word into a conductive state in response to a first signal level at a first current electrode of the first thyristor during a write cycle;
    placing a second thyristor storage element of the memory word into a non-conductive state in response to a second signal level at a first current electrode of the second thyristor storage element during the write cycle; and
    refreshing the first thyristor storage element during a refresh mode by providing a high-signal level to the first current electrode of the first thyristor storage element while a first low-signal level is provided to the second current electrode of the first thyristor storage element.

11. The method of claim 10 further comprising:
    refreshing the second thyristor storage element during the refresh mode by providing a second low-signal level to the first electrode of the second thyristor storage element while the first low-signal level is provided to the second current electrode of the second thyristor storage element.

12. The method of claim 11 wherein refreshing the first and second thyristor storage elements occurs during write-back portion of a refresh mode, the refresh mode further comprising reading the memory word during a read-back portion prior to the write-back portion.

13. The method of claim 11 further comprising:
    providing a hold signal level to the control electrode of the first thyristor storage element and to the control electrode of the second thyristor storage element, the first low-signal level being between the hold signal level and the high-signal level.

14. The method of claim 10 further comprising:
    refreshing the second thyristor storage element during a refresh mode by providing the high-signal level to the first current electrode of the second thyristor storage element while the first low-signal level is provided to the second current electrode of the second thyristor storage element.

15. The method of claim 14, wherein the first low-signal level and the second low-signal level are ground voltage levels.

16. The method of claim 14, wherein the first low-signal level is a voltage less than a ground voltage level and the second low-signal level is the ground voltage level.

17. The method of claim 10 further comprising:
    providing a hold signal level to the control electrode of the first thyristor storage element and to the control electrode of the second thyristor storage element, the first low-signal level being between the hold signal level and the high-signal level.

18. The method of claim 10 wherein refreshing the first and second thyristor storage element occurs during a write-back portion of a refresh mode, the refresh mode further comprising reading the memory word during a read-back portion prior to the write-back portion.

* * * * *